United States Patent [19]

Berndt

[11] Patent Number: 4,580,066
[45] Date of Patent: Apr. 1, 1986

[54] FAST SCAN/SET TESTABLE LATCH USING TWO LEVELS OF SERIES GATING WITH TWO CURRENT SOURCES

[75] Inventor: Dale F. Berndt, Plymouth, Minn.
[73] Assignee: Sperry Corporation, New York, N.Y.
[21] Appl. No.: 592,148
[22] Filed: Mar. 22, 1984
[51] Int. Cl.[4] .............................................. G11C 11/40
[52] U.S. Cl. .................................... 307/276; 307/455; 307/467; 307/291; 371/25
[58] Field of Search ................ 307/443, 454, 455, 559, 307/465–467, 272 R, 272 A, 276, 291; 365/190; 371/25; 324/73 R, 158 R

[56] References Cited

U.S. PATENT DOCUMENTS

| | | | |
|---|---|---|---|
| 3,466,544 | 9/1969 | Balderston | 324/158 R |
| 3,783,254 | 1/1974 | Eichelberger | 307/272 R X |
| 4,071,902 | 1/1978 | Eichelberger et al. | 324/73 R X |
| 4,274,017 | 6/1981 | Carter et al. | 307/291 X |
| 4,298,980 | 11/1981 | Hajdu et al. | 371/25 |
| 4,311,925 | 1/1982 | Chang et al. | 307/455 |
| 4,476,431 | 10/1984 | Blum | 324/73 R |
| 4,493,077 | 1/1985 | Agrawal et al. | 371/25 |
| 4,546,272 | 10/1985 | Suzuki et al. | 307/455 |

OTHER PUBLICATIONS

Braeckelmann et al., "A Masterslice LSI for Subnanosecond Random Logic", IEEE ISSC Conf., Feb. 16–18, 1977, Phila., pp. 108–109.
Berglund, "Level-Sensitive Scan Design Tests Chips, Boards, System", Electronics vol. 52, No. 6, Mar. 1979, pp. 108–110.
Canova et al., "LSSD Compatible D-Function Latch", IBM TDB, vol. 25, No. 10, Mar. 1983, pp. 5196–5198.

Primary Examiner—Stanley D. Miller
Assistant Examiner—D. R. Hudspeth
Attorney, Agent, or Firm—William C. Fuess; Glenn W. Bowen

[57] ABSTRACT

A circuit of 24 transistors and 16 resistors forming an interconnected constant current source, two differential current switches, and level shifter receives scan/set test data, clock, and enablement signals for, when connected to each of the set Q and clear $\bar{Q}$ output signals of a differential feedback latch, enabling scan/set testability of such latch. Both the latch and the connected circuit, forming in aggregate a scan/set testable latch, are implementable in Emitter Coupled Logic or current Mode Logic from standard cells of gate array technology using two levels of series gating and two current sources, which standard cells are otherwise useful for the generation of other logic macros. The differential feedback latch, experiencing but a small added capacitance from the connected circuit, continues to operate fast during normal operation, but is slow in operation for scan/set test wherein the connected circuit needs overcome differential feedback loops within the latch which are still active.

12 Claims, 14 Drawing Figures

TWO RANKS OF SCAN/SET TESTABLE LATCHES

TRUTH TABLE LEGEND

| CHARACTER | DESCRIPTION |
|---|---|
| L | LOW (0) |
| H | HIGH (1) |
| BLANK | DON'T CARE |
| — | NO CHANGE |

Fig. 6c

| NUMBER COMB. | TRUTH TABLE ||||||| ||
|---|---|---|---|---|---|---|---|---|
| | IN |||||||  OUT ||
| | A | B | C | D | E | F | G | Q | Q̄ |
| 2 | L | L | L | L | L | L |   | L | H |
| 2 | H | L | L | L | L | L |   | L | L |
| 2 | L | H | L | L | L | L |   | L | L |
| 2 | H | H | L | L | L | L |   | H | L |
| 12 | A |   | L | L | H |   | L | A | Ā |
|    | A |   | L | L |   | H | L | A | Ā |
| 24 |   | B | H |   | L | L |   | B | B̄ |
|    |   | B |   | H | L | L |   | B | B̄ |
| 6 | H |   | L | L | H |   | H | L | L |
|   | H |   | L | L |   | H | H | L | L |
| 6 | L |   | L | L | H |   | H | L | H |
|   | L |   | L | L |   | H | H | L | H |
| 36 |   |   | H |   | H |   | L | — | — |
|    |   |   |   | H | H |   | L | — | — |
|    |   |   | H |   |   | H | L | — | — |
|    |   |   |   | H |   | H | L | — | — |
| 36 |   |   | H |   | H |   | H | L | H |
|    |   |   | H |   |   | H | H | L | H |
|    |   |   |   | H | H |   | H | L | H |
|    |   |   |   | H |   | H | H | L | H |

Fig. 6d

FAST SCAN/SET TESTABLE LATCH USING TWO LEVELS OF SERIES GATING WITH TWO CURRENT SOURCES

REFERENCE TO RELATED APPLICATIONS

The instant application discloses subject matter also disclosed in another related patent application filed on the same day as the instant application, the other application being further identified as:

U.S. Ser. No. 592,149 entitled FAST SCAN/SET TESTABLE LATCH USING TWO LEVELS OF SERIES GATING WITH ONE CURRENT SOURCE filed in the name of D. B. Berndt.

For the convenience of those who may not have occasion to read the other application, it may be considered to teach a fast scan/set testable latch efficient in power, in number of current sources (one less than the latch of the present invention), in number of electrical components (6 fewer transistors and 5 fewer resistors are utilized in the ECL version than in the latch of the present invention) and in area of silicon implementation for ECL or CML cellular gate array structures. The scan/set testable latch of the other application attains its efficiency through a trade-off in operational characteristics, similarly to the manner in which the latch of the instant application will trade off speed of performance in the scan/set test mode for economy of implementation. The trade-off taken in the scan/set testable latch of other patent application is instead, however, that indeterminancy of outputs in respect of certain combinations of inputs should be countenanced in order to allow economy of implementation. Taken jointly, the instant application and the related patent application generally teach that it is possible to consider trade-offs in the economical implementation of scan/set testable latches implemented in ECL or CML cellular gate array structures.

BACKGROUND OF THE INVENTION

The present invention generally concerns a scan/set testable latch constructed in Emitter Coupled Logic (ECL) or Current Mode Logic (CML) cellular gate array structures. The present invention specifically concerns the efficient construction of a scan/set testable latch from cellular gate array structures which are elsewheres utilizable in implementation of other logic macros. This commonaity of the cellular gate array structures from which the fast, efficient, and scan/set testable latch of the present invention is constructed is a primary reason that such latch will have two levels of series gating. The present invention will specifically concern a fast scan/set testable latch using two levels of series gating which is efficient of implementation by virtue of being powered with two (only) current sources, such limited number of current sources as create efficiencies in silicon implementation. Such efficient implementation, and utilization of minimal current sources, will be obtained in the latch of the present invention because it operates slowly within the scan/set test mode while remaining fast for normal, system mode, operations.

The purpose of the present invention is to provide a fast, efficiently implementable, scan/set testable latch circuit constructed of common cellular gate array structures used in digital logics, such as the logics of high performance central processing units. It is known in the prior art that such a latch should be fast in order to allow the logical funtions implemented thereby such latch to transpire with maximum speed. It is further known that, because of the fact that approximately 30 to 50 percent of some digital logic designs, such as those of central processing units, are involved in latches and their supporting scan/set circuits, such latches should be efficient of implementation, utilizing a minimum of silicon area and a minimum of power.

The fast ECL/CML latch of the present invention is scan/set testable, and, indeed, may be considered to derive some of its efficiencies of implementation by the manner in which scan/set testing is performed by such latch. Scan/set testing is a well known prior art means of testing increasingly complex digital logics with their attendant increasingly difficult problem of thorough testing. As the gate-to-I/O pin ratio has cont:nued to increase with new technologies, the ability to control and observe internal nodes of digital logic circuits has continued to decrease. Where the ratio of logic gates to I/O pins is large, as in very large scale integrated gate array technology, the utilization of the scan/set test technique greatly increases the testability of a logic circuit, allowing nearly 100% coverage of the contained gates. The scan/set test technique allows the internal registers of the circuit under test to be used as virtual I/O pins, thus reducing the logic gate-to-I/O pin ratio. This has the advantage of increasing the controllability of the digital logic circuit under test. The use of the scan/set test technique eliminates the requirement for manual generation of test vectors for digital logic circuitry. Manual generation of test vectors is very undesirable because of the excessive amount of designer time required, and because of the potential inadequacy of test coverage.

Scan/set testability in accordance with the prior art and with the present invention is implemented by the utilization of flip-flops, or latches, which have two data inputs: a parallel data input for normal operation and a serial data input for scan/set test operation. The selection etween the two data inputs, between normal and scan/set data, is controlled by the distribution either of functional clock signals which do enable the usage of normal data, or by both scan/set clock plus scan/set test enablement signals which do enable the usage of scan/-set data. The use of scan/set testable flip-flops, or latches, provides two major advantages. The first advantage is to allow the utilization of such flip-flops, or latches, during normal operation of the digital logic circuitry as latches or, combinatorially, as a functional register. The second advantage is to allow information to be shifted into the flip-flop (providing controllability) as well as allowing retrieval of information from the flip-flops (providing observability). The input function is termed "set" while the output shift is termed "scan". Both operations can be performed at once if the data to be input for the next test step may be anticipated while the output of the present step is being examined.

A scan/set testable flip-flop, or latch, functions in two modes under the control of separate system clock, or a scan/set test clock plus a scan/set test enablement. The two modes of operation are commonly called the System Mode and the Scan/Set Test Mode. In the Scan/Set Test Mode, the latch is used for the testing and maintenance of digital circuits, including large scale integrated (LSI) circuits. The same performance of the latch is not normally required, but within the prior art is normally offered, in the Scan/ Set Test Mode as in the System Mode. Conversely, and more importantly, the performance of the latch in System Mode is often considerably less than would be obtained by a latch not incorporating scan/set testability because of the very inclusion of such testability, which will later be seen to add, within the prior art, either delay in series gating the latch and/or considerable extra capacitive load to the latch.

The present invention is implemented in gate array technology from common cellular gate array structures. The prior art gate array is a general utility chip design providing complete but unconnected multi-transistor cells, arranged in a regular matrix. The gate array leaves the interconnection of its transistors undefined, such interconnection to be determined at function design time by each designer, usually working with predefined functions on "books", and implemented in the mask levels which deposit the metallization layer interconnects. The argument for the gate array is that a gross reduction in lead time and cost may be obtained where a custom design is not feasible or cannot be justified on the basis of performance or size. The "internal" cell types are typically arranged in immediately abutting locations, in rows separated vertically by routing channels reserved for horizontal metal runs. Connection of the cell to the horizontal metal routes is achieved with polysilicon or metal routes that are part of the basic cell design projecting out into the horizontal channels. All internal cells are identical, and are within themselves laid out so that the specified number of interconnect paths may cross through them in the vertical direction. There is also a vertical routing channel on either end of the rows. The chip is personalized by etching connect points and laying down horizontal and then vertical metalization routes.

For gate array applications, a common cellular array construction consisting of a fixed set of electrical components, called a cell, must be used to efficiently implement various simple functions, such as NAND gates and invertors, as well as the scan/set testable latch function. A minimum cluster of components and/or interconnect that might be used in gate array technology to perform a logic function may be called a quarter cell. Such a quarter cell might typically minimally consist of nine transistors, five emitter followers, four inter-macro pull-down resistors, two level shifter pull-down resistors, two swing resistors, one TEE resistor, one glitch resistor, and one current source resistor. Other combinations are possible, the pertinent concept being merely that the construction of a scan/set latch in gate array technology should be efficient in the utilization of those common cellular array structures which are elsewheres utilizable for the implementation of other primitive digital functions. For all such primitive functions, including the scan/set latch, the gate array interconnect is further used to connect these primitive functions into larger constructions, such as scan/set testable flip-flop pairs, and subsequently into macro functions like counters, registers, decoders, comparators, etc. Such macro functions called "books" constitute the "library" for an individual gate array type. Around the periphery of the gate array are located other cell types which are used for input/output, clock, or power regulation. The book in the library of a gate array are those functions which the gate array designer thought would be useful, and have been designed in anticipation of use. Libraries are augmented as users develop needs for other functions.

So recognizing that the prior art common cellular gate array structures, which common cellular gate array structures are utilized to implement the fast scan/set testable latch of the present invention, needs also be utilized to efficiently implement other combinatorial logic macros, the prior art implementation of scan/setable latches has generally suffered by the implementation of latches which utilize available components in too formal an emulation of the standard, logical-specification-type, bullet and shield representation of a scan/set testable latch. In other words, the controllable gating of scan/set test data onto a latch, thus making such latch scan/set testable, is normally logically represented by various combinations of AND, OR, and NOR gates occurring in front of such latch. Particularly in the case of series gating, these equivalent AND, OR, and NOR logic gate representations do not necessarily represent the equivalent gate delays. The logic designer who starts to implement his/her scan/set testable latch in emulation thereof such AND, OR, and NOR logical functions is precluding himself/herself from identifying the most efficient overall implementation of a scan/set testable latch by failing to take a totally integrated view of the entire structure. In other words, the traditional and standard mode of logical representation by bullets and shields is an obstacle to envisioning the integrated construction of a scan/set testable latch.

In particular, one prior art implementation of a scan/set testable latch slavishly imitates the two levels of series gating which do allow scan/set or system data to be applied to such latch, and thus requires three current sources in implementation. In recognition that three current sources are not desirable on the grounds of efficiency in silicon implementation, another prior art scan/set testable latch has been implemented with but a single current source but which such scan/set testable latch then uses three levels of series gating. Such three levels of series gating, if implemented in gate array technology, must be accomplished with those identical common cellular gate array structures which needs elsewise be utilized for combinatorial logic macros. But very few, or none, of such macros require so many as three levels of series gating. Thus, the solution of the multiple current source inefficiency in the prior art by reversion to a scan/set testable latch circuit utilizing three levels of series gating is a poor solution. Some sort of comprehensive approach to the efficient implementation of a scan/set testable latch, such approach as is taken in consideration of speed of operation in gate delays and in consideration of silicon efficiency, as opposed to being guided by too rigorous a replication of the (arbitrary) logical standard representation thereof such scan/set testable latch, is seemingly called for.

SUMMARY OF THE INVENTION

The present invention is a scan/set testable latch circuit constructed in Emitter Coupled Logic (ECL) or Current Mode Logic (CML), which latch efficiently utilizes a minimum amount of silicon area. The scan/set testable latch circuit is particularly suitable for implementation in cellular gate array technology, and for use within Large Scale Integrated (LSI) or Very Large Scale Integrated (VLSI), or Ultra Large Scale Integrated (ULSI) circuits.

The scan/set testable latch circuit of the present invention, whether implemented in ECL or CML, utilizes two levels of series gating. Two levels of series gating appears optimal when the latch of the present invention is constructed, as is the case in the preferred embodiment implementation thereof such latch, from common cellular gate array structures which are also utilized in implementation of other combinatorial logic macros, such logic macros as seldom require more than two series gated levels. Two levels of series gating also gives the best delay-power product for the scan/set testable latch. Three levels of series gating would require higher voltage for operation and the necessity of generating and distributing the additional reference voltage.

Operating with two series gating levels, the number of current sources required to implement the scan/set testable latch of the present invention is a figure of merit thereof such latch. The present invention of a scan/set testable latch with two levels of series gating is implementable with two (only) current sources. Since the number of current sources utilized in the latch needs be distributed within the gate array structure, the latch of the present invention utilizing only two current sources is efficient of implementation in silicon.

The method by which the present invention achieves its efficiency of implementation is that the scan/set testable latch of the invention, functioning with the same high performance as any (scan/set testaole or not) ECL/CML latch in normal mode, will sacrifice high performance in the scan/set test mode in favor of an economy of silicon area in implementation. This trade-off is a good one because in the scan/set test mode, wherein the latch is used for testing and maintenance of LSI circuits, the high performance is not needed. To repeat, in the normal, system, mode the scan/set testable latch of the present invention functions with nearly identically the same speed as a standard high performance ECL/CML latch. This near identicality in speed of performance during normal, system, mode is considerably faster, and better, than prior art implementations of scan/set testability on ECL or CML latches. However, in the scan/set test mode, the scan/set testable latch of the present invention will allow that a feedback loop, which feed-back loop accords high performance to normal mode operation, will still be active necessitating that the scan/set current source needs force additional current against such feedback loop to overpower the existing state of the active latch and cause the latch to tumble to the opposite state. In such scan/set test mode, the current source must force the collector node of the latch, still active, to nearly the opposite state before the latch feed-back takes over. This mechanism of conflicting current drives makes the latch of the present invention slow in the scan/set test mode, but when such conflicting current drive is inactive during normal, system, mode then the latch of the present invention will experience but only a very small additional capacitance to that which would be present should the latch not be scan/set testable, such additional capacitance as has negligible effect in normal operation. High performance is not necessary in the scan/set, or maintenance, test mode. If the scan/set testable latch of the present invention were to be identified by what it does as opposed to what it is, it might well be called a fast ECL/CML latch, makable from common gate array cellular structures, which is efficient because the latch operates slowly for scan/set testing.

Describing the scan/set testable latch of the present invention by what it is, it may be considered a circuit apparatus appended to a prior art feedback latch (not of itself scan/set testable) employing two levels of series gating and two current sources, such appended circuit apparatus plus such prior art latch providing, in aggregate, a scan/set testabale latch. Such circuit apparatus is appended to such prior art latch by connection to the set Q and clear $\overline{Q}$ signal outputs thereof such latch. The appended circuit apparatus serves, through such connections, to set and clear the latch—also commonly called backset and backclear being that such is accomplished through the normal output signal lines of the latch - responsiveiy to enabled and clocked scan/set test data, and regardless of such feedback currents within the latch as are continuously and simultaneously operative. The particular appended circuit apparatus which accomplishes this backsetting or backclearing of the latch in accordance with the scan/set test data does itself employ two levels of series gating, and utilizes the same two current sources. The particular appended circuit consists of 1) a current source (preferably a constant current source), plus 2) a first current switch (preferably a differential current switch) collector dotted connected with each one of the set Q and clear $\overline{Q}$ signal outputs of the feedback latch circuit which, when supplied with a current from the current source, switches this current responsively in accordance with the binary state of the scan/set data input signal either to backset or to backclear the latch, or which, when not supplied with a current, does naught but present a small (foil) capacitance to the signal outputs of such feedback latch circuit (thusly but minutely affecting the normal mode operational speed of such latch), plus 3) a second current switch (preferably a differential current switch) for directing the current from the current source responsively in accordance with scan/set enablement and clock signals to either the first current switch in the case of both enabled and clocked scan/set test, or to ground (thus disabling that any scan/set data should be used by the first current switch to backset or to backclear the latch) when scan/set test is either not enable, not clocked, or both. Thus is a scan/set testable latch achieved.

There are additional, subsidiary, features, which features are normal of inclusion in prior art scan/set testable latches, incorporated within the latch of the present invention. Provision is made in the scan/set testable latch of the present invention to provide a logical "AND" between the system clock and the system enable, such condition as is preferred by systems designers. Furthermore, the scan/set testable latch of the present invention supports multi-phase clock systems wherein four or more phases are used in the system data path while only two phases are used in the scan/set path. Finally, the preferred embodiment scan/set testable latch of the present invention is preferably constructed in versions with either a set, or a reset, function. Both functions are not enabled in order to save components: system designers normally require only one such function so that the scan/set chain may be initialized with an alternate pattern of "1's", or "0's", respectively as the latch version does either enable the set, or the reset, function. It is possible, if desired, to incorporate both the set and the reset function in one scan/set testable latch. Finally, the scan/set testable latch, of the present invention provides both true (Q) and complement ($\overline{Q}$) signal outputs, both signal outputs which are normally desired by systems designers. Such additional and subsidiary features merely mean that the scan/set testable latch of the present invention is well-balanced, and is not denuded of useful accommodations to real-world system usage merely in order to be fast and/or efficient.

Correspondingly, it is the first object of the present invention that a fast scan/set testable latch should be constructable from common cellular array structures which are elsewise effectively utilizable in the implementation of other combinatorial logic macros in gate array technology. In particular, this means that the scan/set testable latch of the present invention will utilize two (only) levels of series gating. Such two levels of series gating is reflective of a common cellular gate array structure which is more readily, and commonly, utilizable in the creation of standard combinatorial logic macros than would be any gate array structure which incorporates three or more levels of series gating. For example, the minimum building block of the preferred embodiment scan/set testable latch of the present invention is called a quarter cell, and consists of nine transistors, five emitter followers, four intermacro pull-down resistors, two level shifter pull-down resistors, two swing resistors, one TEE resistor, one glitch resistor, and one current source resistor. Although the contents of such a common cellular gate array structural building block are arbitrary, it needs be kept in mind that such building block should be suitable for the efficient implementation of combinatorial logic macros as well as the present invention of a scan/set testable latch. Such efficient utilization of this "quarter cell" building block, and like common cellular gate array structural building blocks, quickly dictates that a maximum of two levels of series gating should be employed. Precisely two levels of series gating is a characteristic of the scan/set testable latch of the present invention.

It is a second object of the present invention that, having fixed upon two levels of series gating which gives a good delay-power product and which is implementable with common cellular gate array structures elsewise utilizable for combinatorial logics, that the scan/set testable latch of the present invention should exhibit a high figure of merit by utilizing minimal numbers of current sources. Each current source utilized requires generation and requires the silicon area for distribution to the latch. Sinces latches are exceptionally common in large digital logic designs, often comprising from thirty to fifty percent of all logic, minimal utilization of current sources with the attendant efficiency of silicon implementation is important. The present invention will show the implementation of a fast scan/set testable latch with two (only) current sources.

It is a third object of the present invention, realization of which object essentially allows the attainment of the first two objects, that the speed of operation in scan/set test mode of the scan/set testable latch of the present invention should be traded off for economy of silicon implementation. The method by which the present invention is able to utilize only two current sources is that speed of operation in the scan/set test mode will be sacrificed for efficiency of silicon implementation. In particular, a primary current source will be steered in the scan/set test mode regardless that the feed-back portion of the standard latch (contained within the scan/set testable overall latch) is active. The state of this feed-back latch is thusly difficult to change, and the appended circuitry of the present invention which forcibly changes the state of this feed-back latch will enable the overall scan/set testable latch to operate but slowly in scan/set test since this feed-back is active.

BRIEF DESCRIPTION OF THE DRAWINGS

FIG. 4b shows the circuit schematic of one prior art scan/set testable latch, which latch by selectively gating system data or scan/set data onto a standard (series gated) latch does implement by substantial mimicry the logic function shown in FIG. 4a.

FIG. 5b shows the schematic representation of a prior art latch circuit using three levels of series gating ECL with a single circuit source in implementation of the logic representation of FIG. 5a.

FIG. 6b shows a second logic representation of the scan/set testable latch circuit of the present invention, which logical representation is relatively more detailed than that of FIG. 6a.

FIG. 6c and FIG. 6d respectively show the truth table legend, and the truth table, which describe the operation of the scan/set testable latch circuit of the present invention, input and output letter designations within such FIG. 6d truth table referencing the correspondingly designated signal ports with the schematic diagrams of FIG. 6e and FIG. 6f.

DESCRIPTION OF THE PREFERRED EMBODIMENT

Figure 1:
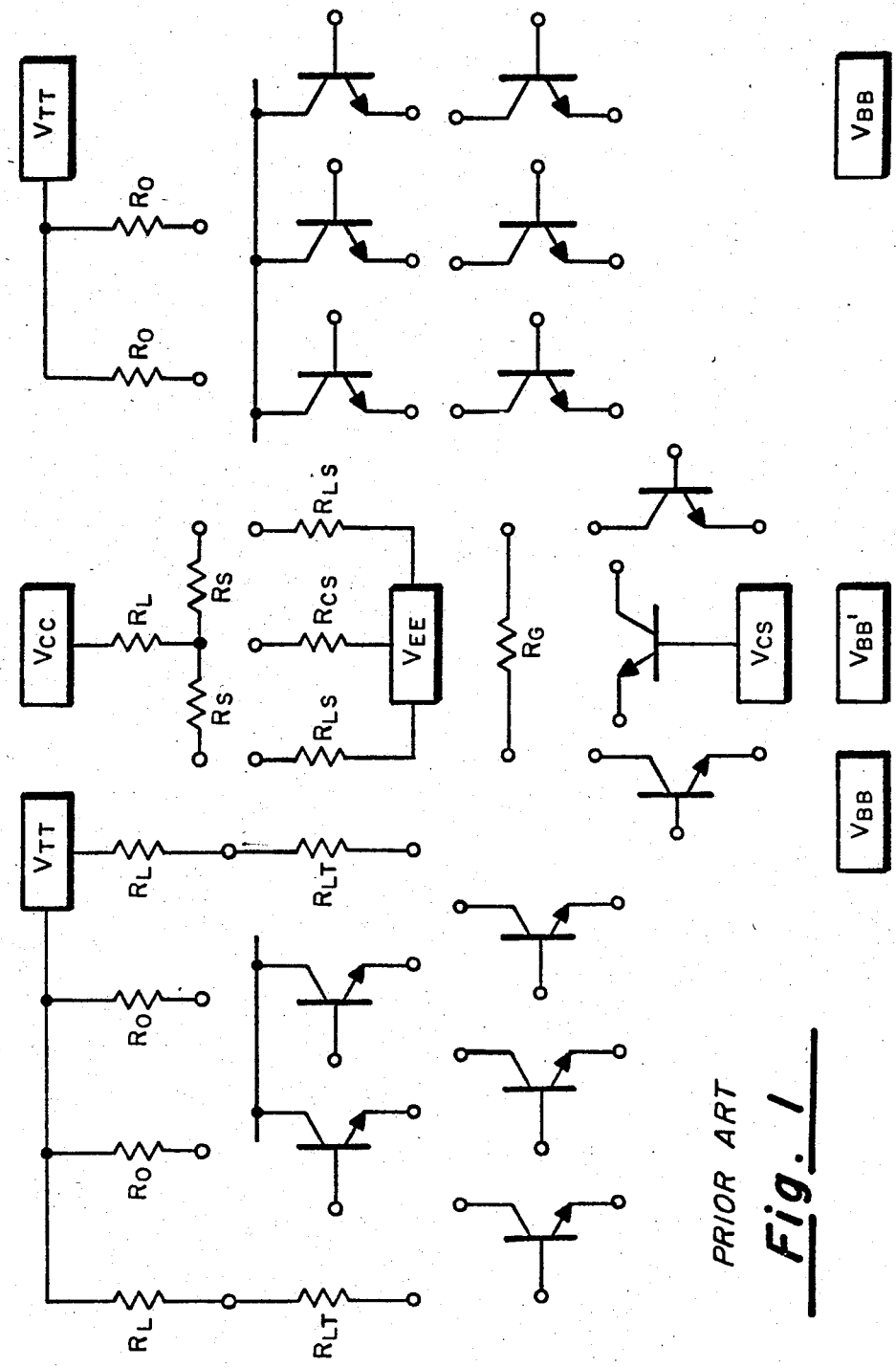
FIG. 1 shows a schematic representation of a prior art internal quarter cell, being a cellular building block in gate array technology.

The present invention is a fast scan/set testable latch employing two levels of series gating which minimizes power, current sources, devices, and silicon area of ECL or CML cellular gate array structures (Bipolar Integrated Circuits) utilized in implementation of the scan/set testable latch.

The purpose of the invention is to provide a fast scan/set testable latch circuit implemented in gate arrays particularly for high performance Central Processing Units (CPU's). Because of the fact that about 30 to 50 percent of the CPU's logic is involved in latches and the supporting scan/set circuits, there exists a need for an efficient scan/set latch. An efficient latch circuit should use a minimum of silicon area, minimum of power, and a maximum of speed.

The scan/set testable latch of the present invention functions in two modes under the control of separate system enables and scan/set test enables. The two modes of operation will be called the System Mode and the Scan/Set Test Mode. In the System or Normal Mode, the latch functions the same as any high performance CML or ECL latch. In the Scan/Set Test Mode, the latch is used for resting and maintenance of LSI circuits. In the test mode, the high performance of the CML or ECL circuitry is not needed.

The primary goal for the scan/set testable latch of the present invention is to provide a fast latch in the system mode using a minimum of silicon area and a minimum number of current sources. To achieve this goal, a sacrifice, or trade-off, was made. This sacrifice, or trade-off, is that the scan/set testable latch of the present invention is slow in the scan/set test mode, particularly in the scan test mode. The normal high performance of the latch is not needed in the scan/set test, or maintenance, mode. Performance in the scan/set test mode was sacrificed to give the best performance in the system mode.

The advantages so gained by such a sacrifice, or trade-off, are as follows. The scan/set testable latch of the present invention uses two levels of series gating and two (only) current sources. It is fast in system mode. Provisions are made for "ANDing" system clock and system enable, and also for "ANDing" the scan/set test clock and the scan/set test enable. The ECL preferred embodiment implementation of the invention uses only 24 transistors and 16 resistors. The CML preferred embodiment implementation of the invention uses only 18 transistors, 6 resistors and 2 Schottky diodes. The latch is constructable from two quarter cells (which will be defined) of a particular ECL gate array, which quarter cells are well-balanced for the implementation of other logic macros (as well as the scan/set testable latch of the present invention).

Before explanation of the particular latch of the present invention, it is useful to understand the requirements and the constraints for the design of a scan/set testable latch for use in LSI and VLSI gate array applications. First, the scan/set testable latch should be constructable from a common cell structure. For gate array applications, a common cellular array structure consisting of a fixed set of electrical components must be used to efficiently implement lhe scan/set latch function as well as other combinatorial logic macros. Defining terms, gate array is a form of large scale integration with a fixed set of diffusion layers which define a basic cellular array with customization accomplished by unique metal layers. The particular gate array from which the preferred embodiment of the present invention is implemented consists of three metal layers: two for component interconnect and one to carry the supply voltages and ground. The component clusters, called quarter cells, are interconnected in a series gated Emitter Coupled Logic (ECL) structure. Series gating means multiple levels of basic ECL gates (in this case of the present invention two such levels in series) where logic functions can be performed at each level.

Continuing with the definition of terms, the particular gate array from which the present invention is implemented is nominally 10K ECL compatible. It contains internal quarter cells relevant to the present invention, and additionally, cells not relevant to the present invention such as external cells, output emitter followers, and the reference generators to produce the necessary reference voltages for the ECL circuits. The internal cells are interconnected to form logic functions within the gate array. The internal cells can receive either nominal 10K or 100K ECL signals external to the gate array. Circuits formed by internal cells can drive other circuits formed by internal cells and can drive circuits formed by external cells (which external cells are not relevant to the present invention). However, it should be generally understood that all signals leaving the gate array must go through a circuit formed by an external cell. These circuits will drive an output emitter follower which can drive external nominal 10K ECL circuits.

Continuing with the definition of terms, an internal quarter cell is the smallest group of internal components that can be replicated. The components of a prior art internal quarter cell are shown schematically in FIG. 1. Certain components within the internal quarter cell are grouped together to form the gate level macros. A macro is defined as a cluster of components and/or interconnect that is used to perform a logic function.

Expanding on the explanation of the electrical schematic of the internal quarter cell from (two of) which the present invention is implemented and which is shown in FIG. 1, an internal quarter cell consists of the following groups of components:

Nine transistors to be used in the implementation of internal gate macros (term to be defined) which gate macros will be called upper internal switch, lower internal switch, internal current source, and clamp diode.

Five emitter followers (transistors with collectors tied to ground or $V_{CC}$) to be used in the internal emitter follower, lower internal level shifter, and internal latch network.

Four inter-macro pull-down resistors, $R_O$ of nominal value 621 ohms, to be used with the internal emitter followers.

Two each intra-macro latch pull-down resistors, $R_L$ and $R_{LT}$ of respective nominal values 489 and 1,676 ohms, to be used in the internal latch network.

Two level shifter pull-down resistors, $R_{LS}$ of nominal value 11,978 ohms, to be used in the lower internal level shifter.

Two swing resistors, $R_S$ of nominal value 1,091 ohms, to be used in the upper internal switch.

One TEE resistor, $R_T$ of nominal value 153 ohms, to be used in the upper internal switch.

One current source resistor, $R_{CS}$ of nominal value 742 ohms.

One glitch resistor, $R_G$ of nominal value 39,726 ohms, to be used in the lower internal switch.

Figure 2A:
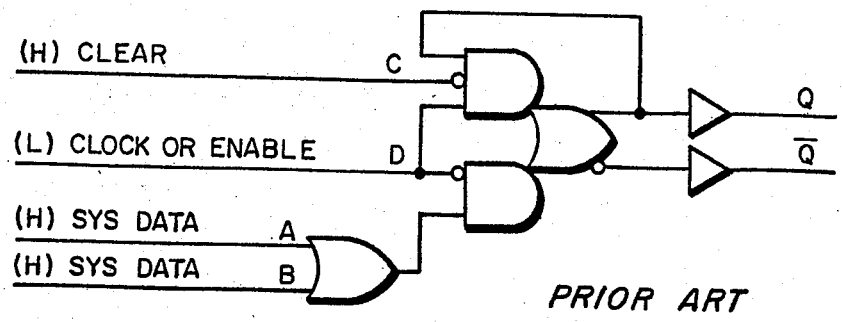
FIG. 2a shows a logical representation of a prior art latch circuit.

The internal quarter cells are utilizable to construct internal gate macros. Rather than merely defining such internal gate macros (which definitions will be useful to understanding the particular circuit of the present invention which, for example, does contain in that appended circuitry which does implement scan/set testability upon a prior art latch a lower internal switch, amongst other internal gate macros), certain pertinent ones are shown, in combination, in FIG. 2b as an example of a (prior art) internal latch (i.e., a latch constructed from internal gate macros). The logic function implemented is shown in FIG. 2a. In particular, the following internal gate macros are recognizable in FIG. 2b.

Figure 2B:
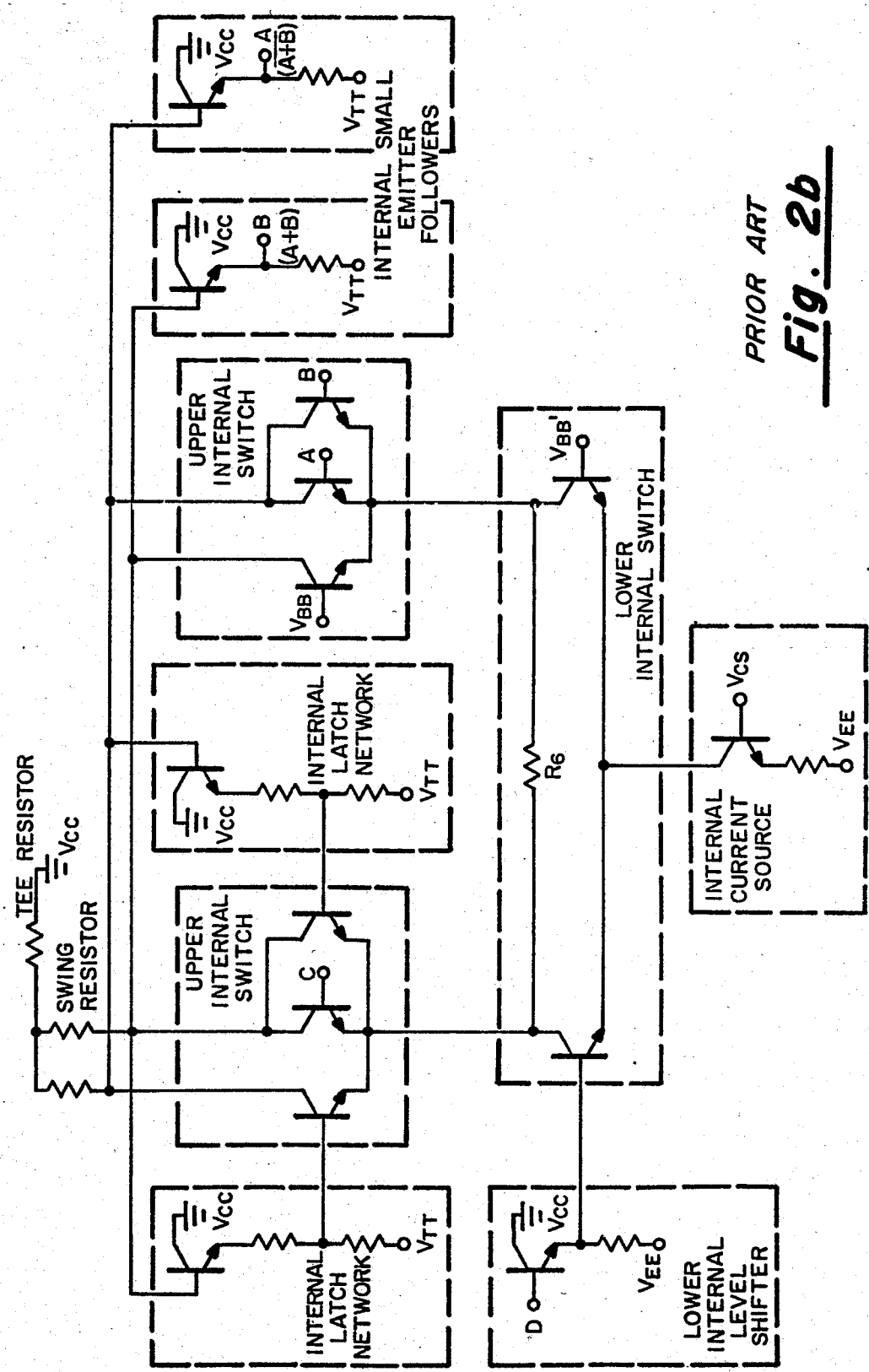
FIG. 2b shows the electrical schematic of the implementation of the prior art latch circuit of FIG. 2a in internal gate array logical macros.

Upper Internal Switch. This current switch consists of up to five current switching transistors. Three transistor upper internal switches are shown in FIG. 2b. The parallel transistors form an OR/NOR with the NOR on the input side.

Lower Internal Switch. This current switch consists of two current switching transistors as shown in FIG. 2b. The lower internal switch forms a positive OR with the upper internal switch.

Internal Glitch Resistor. This is a resistor ($R_G$ in FIG. 2b.) used in the lower internal switch to prevent a floating node from drifting to an abnormal potential which would produce an undesirable voltage transient on the output.

Internal Current Source. The current source consists of a transistor and a resistor connected between two voltage sources as shown in FIG. 2b to form a constant current source for the upper and lower internal switches.

Internal Latch Network. The internal latch network consists of a transistor and a voltage divider as shown in FIG. 2b. This latch network provides the drive to the upper internal switch in latch networks and provides the correct voltage shift for a reset.

Internal Small Emitter Follower. This is the small emitter follower used to drive the other internal and external cells inside the boundaries of the gate array chip. The internal pull-down resistors $R_O$ shown in FIG. 2b are used to bias the internal small emitter followers.

Lower Internal Level Shifter. The level shifter consists of one or two transistors in parallel and one or two pull-down resistors that drive the lower internal switch. Only one such transistor and pull-down resistor is utilized in the latch circuit shown in FIG. 2b. The level shifter forms an OR/NOR with the NOR on the input side and shifts the input voltage one diode drop down to the lower internal switch.

Internal swing Resistor. This is the resistor $R_S$ that connects to the collector of an upper or lower switch to generate the low level voltage. (See FIG. 2b).

TEE Resistor. This is the resistor $R_T$ that connects between the swing resistor and $V_{CC}$ in an internal macro. It generates the voltage for the high level, internal to the gate array. (See FIG. 2b.)

Not utilized in the latch circuit of FIG. 2b, but readily visualizable, the following minor internal gate macro also exists:

Clamp Diodes. These are diodes in parallel with the swing resistor when a collector dot involves more than one current source. Clamp diodes are formed from a transistor which has its base common with its collector. Clamp diodes are shown as transistors T3 and T4 in FIG. 6e.

Continuing now with further requirements and constraints for the design of a scan/set testable latch for use in LSI and VLSI gate array applications, a second such requirement is that high speed be obtained in the system data path. For the present invention, the presence of circuitry appended to a basic latch enabling performance of the scan/set test function is essentially transparent to the performance of the latch in the normal system data path. That is, in the system mode the latch of the present invention functions with essentially the same performance as a prior art latch without the additional, appended, circuitry.

Third, speed is not critical in the scan/set path. Speed in the scan path was sacrificed in the scan/set testable latch of the present invention in order to minimize the silicon area and maximize the performance in the main system path.

Four, separate system and scan/set clock enables are desirable in high performance machines. A separate system clock is desirable so that logic can be removed for the clock fan-out circuits, therefore minimizing clock skew. Often the foil lengths are matched in the clock nets to also minimize skew. System designers prefer an "AND" condition at the input to the latch system clock. Therefore, provisions are made in the scan/set testable latch of the present invention for an "AND" between the system clock signal and the system enable signal.

Five, certain undetermined-output logic states may be allowed only so long as the corresponding input logic states for this condition do not actually occur in system operation. The latch of the present invention has no undetermined or undefined output states, so the impact of any such undetermined-output logic states on system operation, should such have existed as is exhibited by some latches, is not an issue.

Six, support by a scan/set testable latch of a multiphase clock system is desirable. In high performance systems, often 4 or more phases are used in the system data path while only 2 phases are used in the scan/set path. The scan/set testable latch of the present invention is so operable with a 2 phase scan/set clock. A single phase scan/set clock can be used by building an edge-triggered latch out of the Rank A and Rank B latches. This is done by building Rank B with an inverted scan/set clock phase B relative to phase A and tying the scan/set clock phase A and phase B together. An extra test mode input would be needed for the edge-triggered latch to allow testability of such; testability meaning of the edge-triggered latch itself and not scan/set testability which means testing of VLSI and ULSI circuits using a scan/set scheme.

Seven, system designers prefer to have a scan/set latch macro with a set or reset function. Due to the limited number of components available in a gate array quarter cell (shown in FIG. 1), the scan/set testable latch of the present invention will exist in two minor variants, one with a set capability and another with a reset capability. In this way, one can initialize the scan/set chain with an alternate pattern of "1's" and "0's". This alternate pattern is then scanned through the scan/set chain to test for a break in the chain at the gate array or p.c. board test level. It is possible, by using one additional transistor within the preferred embodiment of the invention, to simultaneously implement both the set and reset function.

Eight, system designers prefer a latch with true and complement outputs available. The scan/set testable latch of the present invention so offers both true (Q) and complement ($\overline{Q}$) signal outputs.

Nine, the delay-power product of the latch should be optimized. For comparison purposes, the number of current sources to implement a specific logic function is used as a figure of merit for the different circuit configurations. Minimizing the number of current sources reduces the power yet gives high performance. The number of series gated levels is also used for comparison. Two levels of series gating appears to be a good compromise and gives the best delay-power product for the scan/set testable latch under consideration. Three levels of series gating requires higher voltage for operation and the necessity of generating and distributing the additional reference voltage.

Ten, consideration should be given to the selection of technologies. Since the application for the scan/set testable latch of the present invention is for high speed gate arrays, the scope of the comparison was limited to ECL and CML circuits. The present invention deals with the circuit configuration, style, and form. Absolute delay numbers are not quoted since this would depend on power, layout, and the particular process used.

Eleven, it is desirable to reduce the number of power supply voltages. Two power supply voltages are used in the circuit of the present invention to improve the delay-power product. One supply voltage can be used if desired. The following are some typical voltages for 2 levels of series gating: For ECL, $V_{TT}=-2$ volts and $V_{EE}=-4.5$ volts. For CML, $V_{TT}=-2$ volts while $V_{EE}=3.3$ volts.

Now entering into the specification of prior art scan/set testable latches and of comparison of such to the scan/set testable latch of the present invention, it should be preliminarily understood that, for comparison purposes, the various scan/set latches are not adequately represented solely by the equivalent military standard bullet and shield representation. Particularly in the case of series gating, these equivalent gate logic representations do not necessarily represent the equivalent gate delays. Therefore, these logic representations are not useful for performance comparisons. Also, the undefined output states, if any, of the actual physical electronic implementation are not properly indicated by the bullet and shield logic representation (the electronic implementation of the scan/set testable latch of the present invention has, however, no undefined output states).

Figure 3:
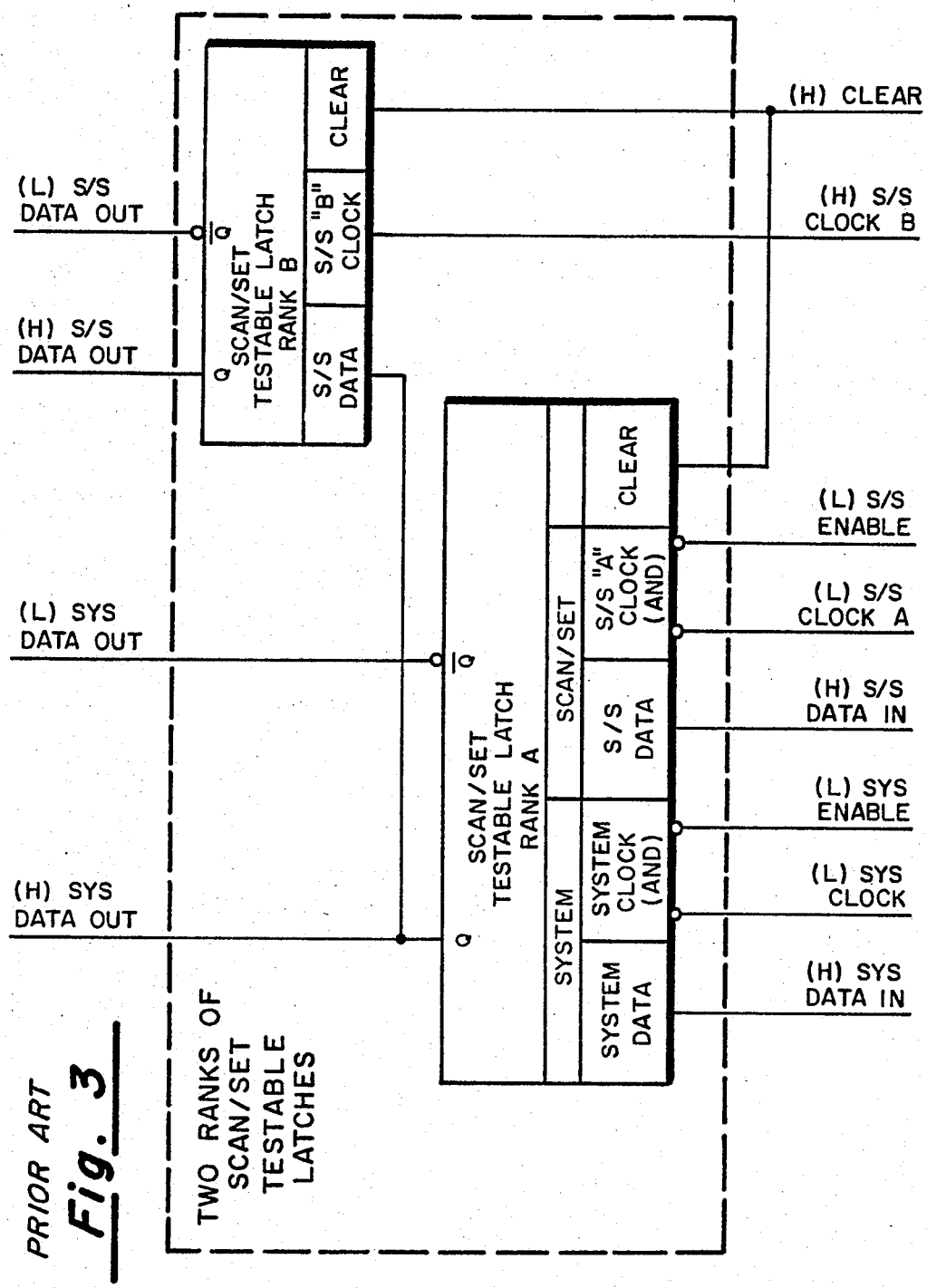
FIG. 3 shows a block diagram of two ranks of scan/set testable latches, which alignment by rank is known in the prior art.

FIG. 3 shows a block diagram of the prior art alignment of two scan/set testable latches. The latches are identified as a Rank A and Rank B latch. Note that the system data output is taken directly off the first Rank A latch and, therefore, gives better performance. The Rank B latch is only in the scan path and, therefore, does not affect system performance. The Rank B latch can be designed with either an active high or low clock using conventional ECL circuits. If the active A clock is low and active and B clock is high, scan clock A and B can be tied together (i.e., clock A and clock B are the identical clock) to form an edge triggered latch for scan/set operation.

The present invention deals only with circuit improvements to the Rank A scan/set testable latch. All the following discussion will refer to the Rank A scan/set testable latch.

Figure 4A:
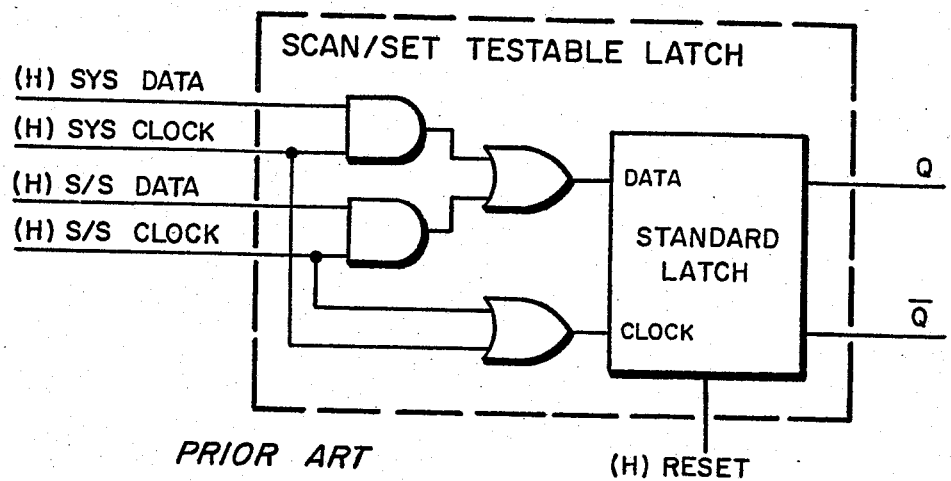
FIG. 4a shows one prior art logical representation of a scan/set testable latch.
Figure 4B:
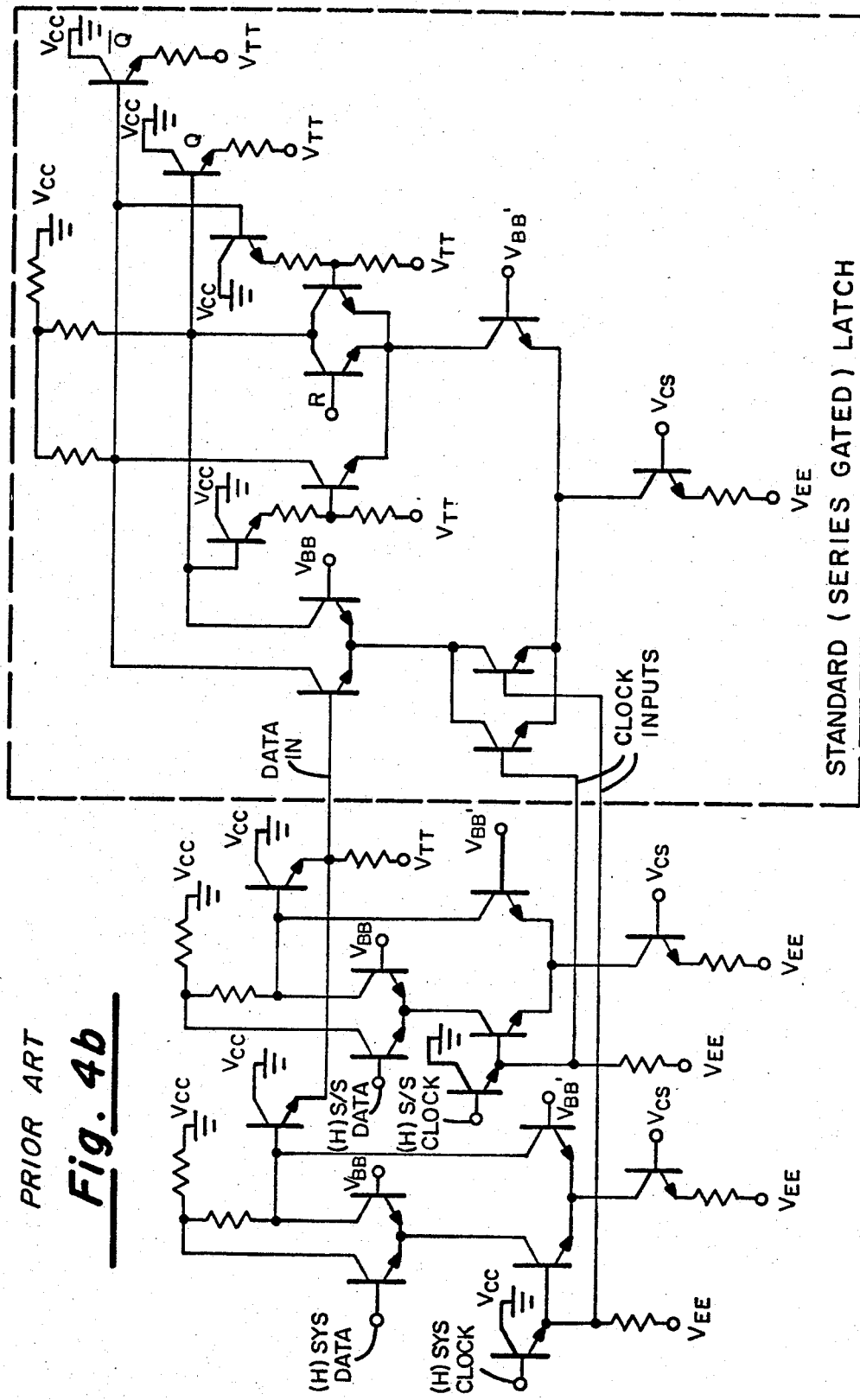

FIG. 4, consisting of FIG. 4a and FIG. 4b, shows a first prior art example for the circuit implementation for the Rank A scan/set testable latch. As is suggested by the bullet and shield logic representation shown in FIG. 4a, in the prior art logic was typically added in front of the latch circuit to effectively gate signals from the system data or scan/set data into the latch. This approach shown in the circuit diagram of FIG. 4b added delay to both the system data path and the scan/set path. Another similar approach would be to place a multiplex circuit in front of the latch, but this would require a common system and scan/set clock.

Figure 5A:
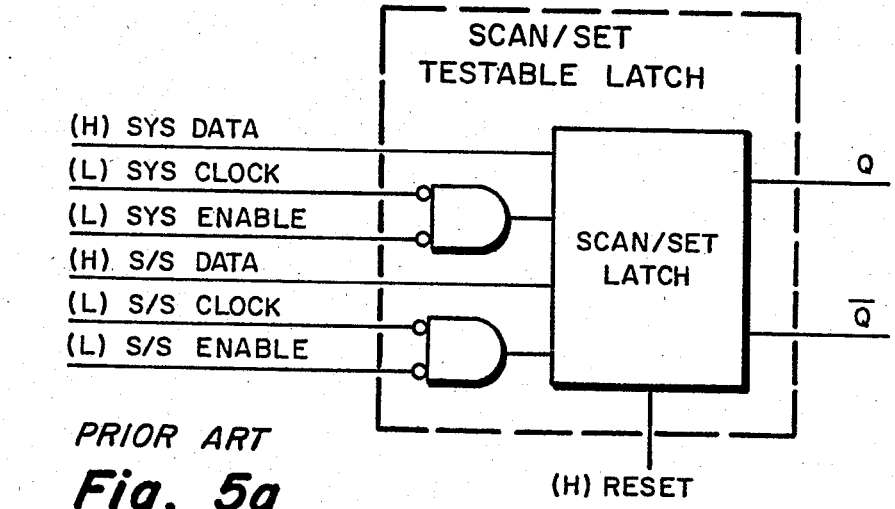
FIG. 5a shows a second prior art logic representation of a scan/set testable latch.
Figure 5B:
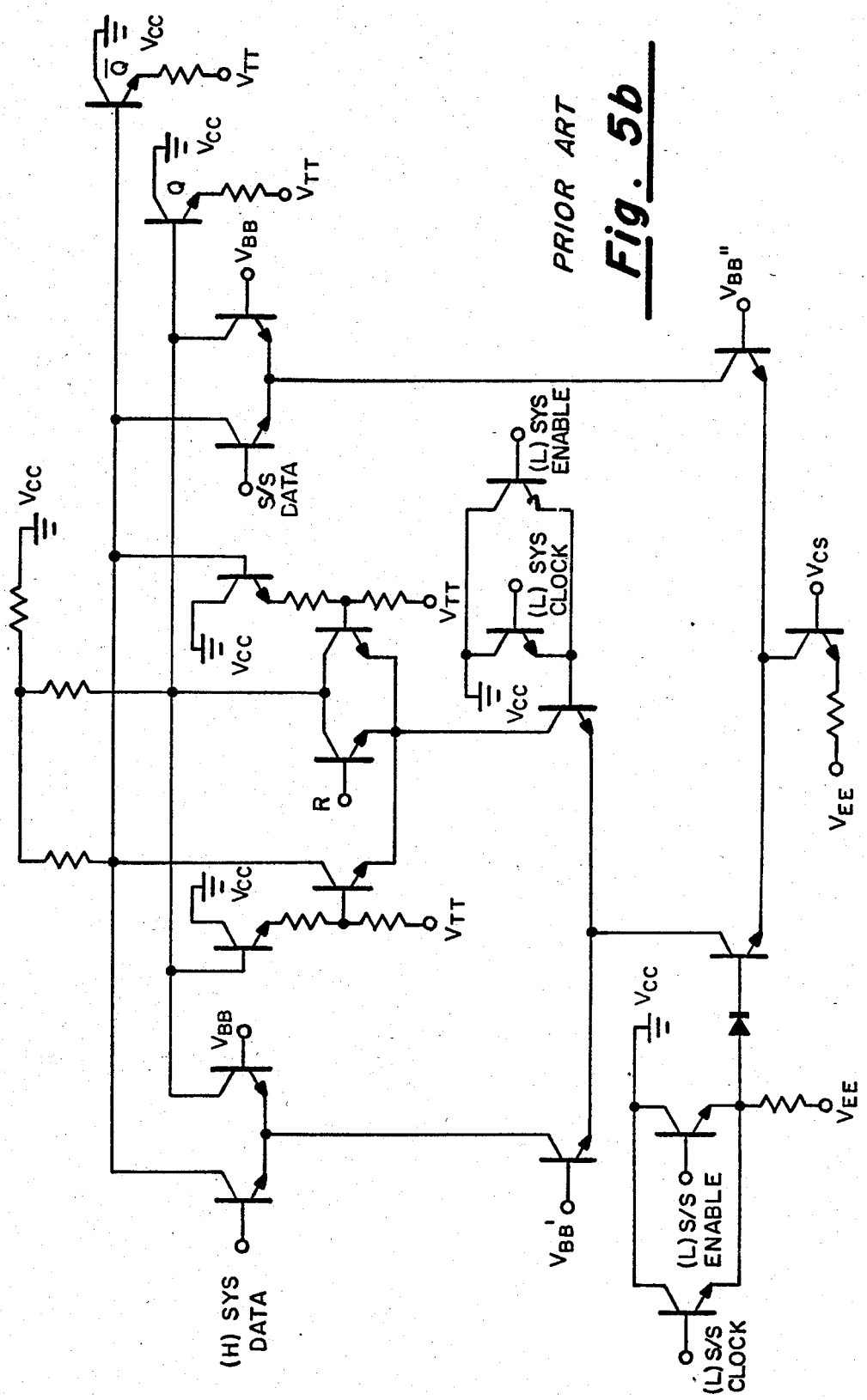

FIG. 5, consisting of FIG. 5a and FIG. 5b shows a second prior art scan/set testable latch circuit implementation using 3 levels of series gating ECL with a single current source. This circuit functions reasonably fast in the system data path and in the scan/set path but requires 3 levels of series gating to implement. The 3 levels of series gating require a higher $V_{EE}$ voltage and an additional reference voltage ($V_{BB}'$, and $V_{BB}''$ are reference voltages). The 3 levels of series gating may be useful for the implementation of the latch function but would not be frequently used by other combinatorial logic for gate array applications. Therefore, the overall delay-power product for the gate array would not be reduced. The 3 levels of series gating, however, does allow an "AND" condition for system clock and system enable. The preceding general principles also apply to 3 levels of CML latch.

Figure 6A:
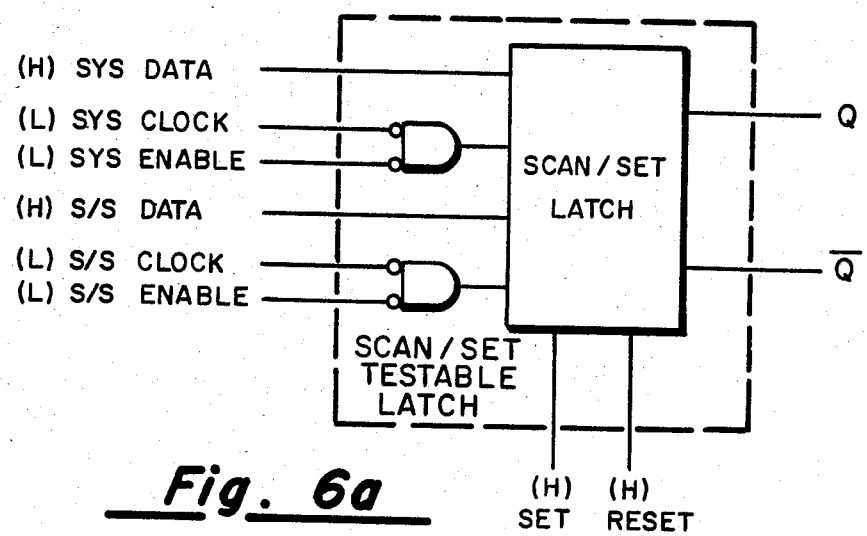
FIG. 6a shows a first, highest level, logic representation of the scan/set testable latch circuit of the present invention.
Figure 6B:
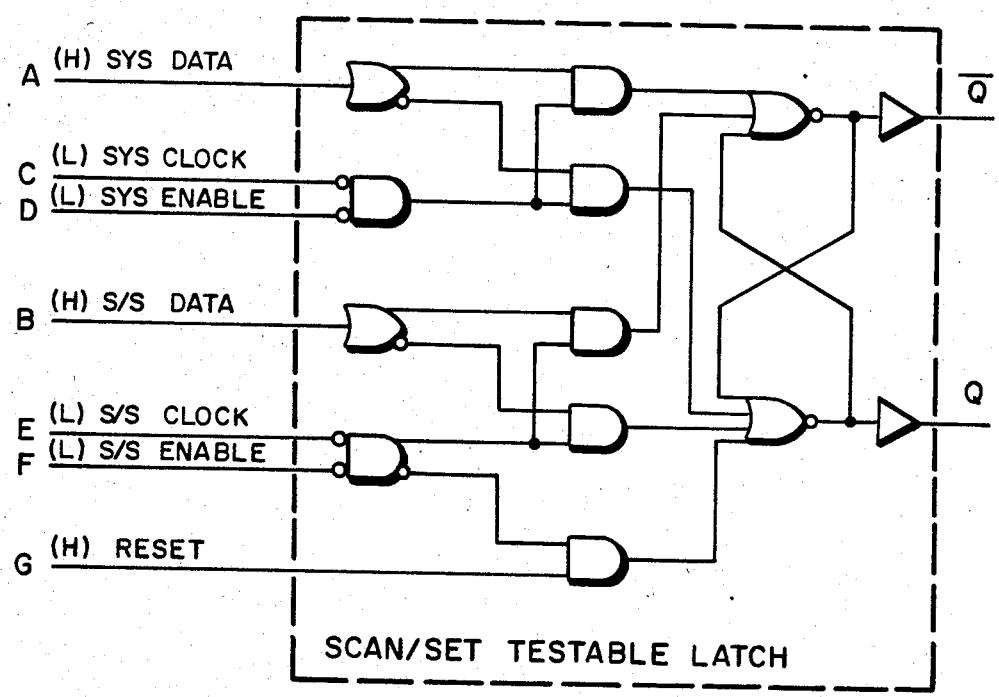

FIG. 6a and FIG. 6b respectively show a crude and somewhat more detailed logic diagram, while FIG. 6c and FIG. 6d respectively show the legend and the truth table for the scan/set testable latch of the present invention using 2 levels of series gating ECL or CML and 2 current sources. The same logic diagram and truth table apply to both the ECL or CML versions of the latch. For simplicity, only the reset variant of the logic and truth table are shown. The set variant of the latch would follow in a similar fashion.

Figure 6E:
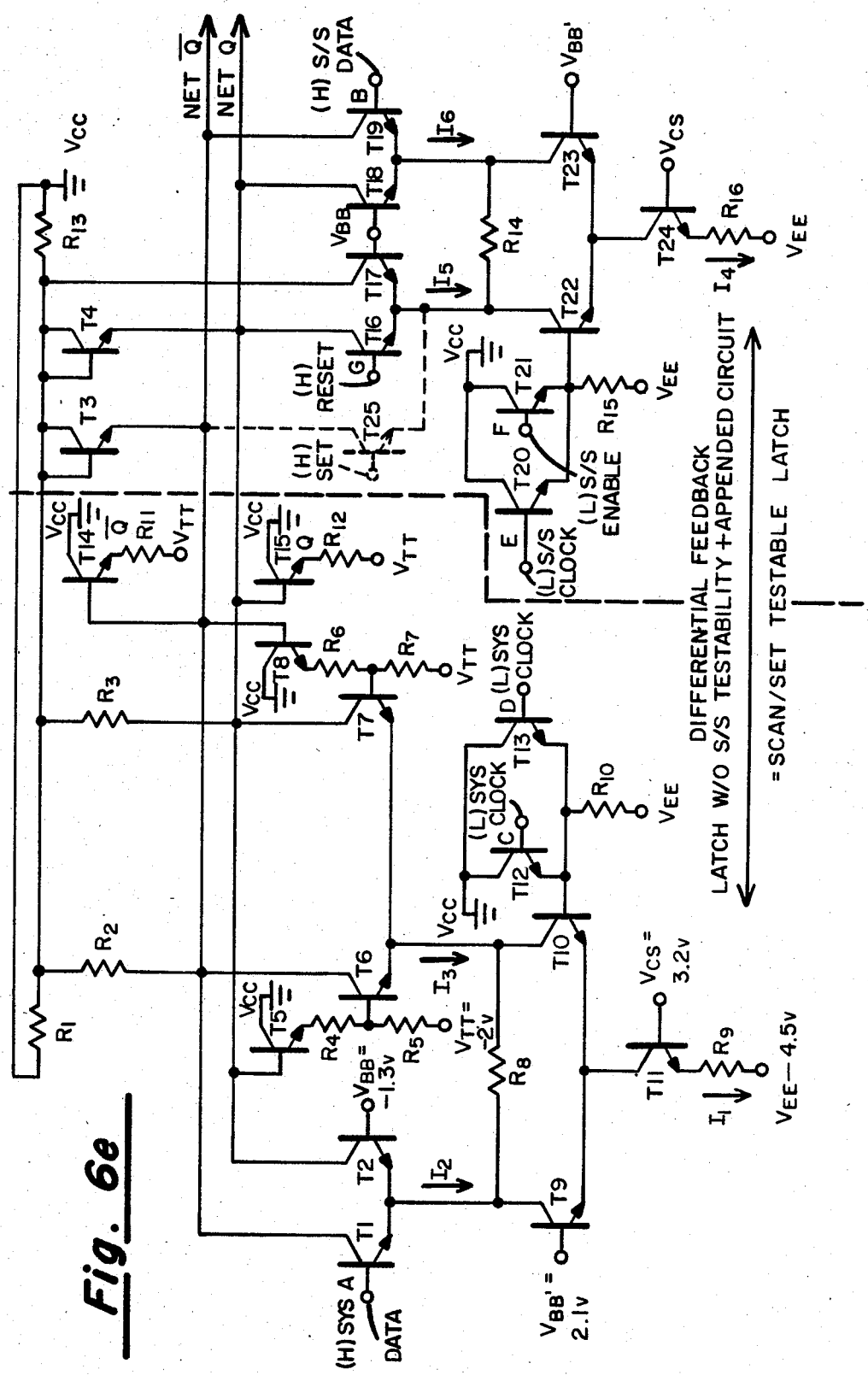
FIG. 6e shows a schematic diagram of the first preferred embodiment of the present invention of a scan/set testable latch when implemented in Emitter Coupled Logic (ECL).

FIG. 6e shows the circuit schematic of the ECL version of the scan/set testable latch of the present invention. This scan/set latch uses 2 levels of series gating ECL and has 2 current sources. The latch macro was designed to use the existing components of the gate array cellular structure previously discussed. This same cellular structure is utilizable to implement a large number of other standard, ECL, series gated macros. The present invention relates only, of course, to the implementation of the scan/set testable latch.

Recognizable in FIG. 6e by correspondence to like elements and structures in FIG. 2b, the transistors T1 through T24 would be attainable from two of the building block standard cells shown in FIG. 1. Further by comparison, resistors $R_1$ and $R_{13}$ are TEE resistors $R_T$ of nominal value 153 ohms. Further by comparison, resistors $R_2$ and $R_3$ are swing resistors $R_S$ of nominal value 1,091 ohms. Further by comparison, resistors $R_4$ and $R_6$ are inter-macro latch pull-down resistors type $R_{LT}$ of nominal value 489 ohms while resistors $R_5$ and $R_7$ are inter-macro latch pull-down resistors type $R_L$ of nominal value 1676 ohms. Further by comparison, resistors $R_8$ and $R_{14}$ are glitch resistors $R_G$ of nominal value 39,726 ohms. Further by comparison, resistors $R_9$ and $R_{16}$ are current source resistors $R_{CS}$ of nominal value 742 ohms. Further by comparison, resistors $R_{10}$ and $R_{15}$ are level shifter pull-down resistors $R_{LS}$ of nominal value 11,978 ohms. Finally by comparison, resistors $R_{11}$ and $R_{12}$ are inter-macro pull-down resistors $R_O$ of nominal value 621 ohms.

Commencing with the function explanation of the scan/set testable latch of the present invention shown in FIG. 6e, first described is the prior art and conventional feedback ECL latch, without scan/set testability, that is shown to the left of the dashed line in FIG. 6e. All latches employ positive feedback via the coupling of active elements: it is by such that they become data storage elements. The latch of FIG. 6e is a differential feedback (cross-coupled) latch, the preferred (but not the only) type with which the appended circuit of the invention to the right of the dashed line will be interoperative to produce scan/set testability. A differential feedback latch means only that both of the output states of such latch, both the set Q and clear $\overline{Q}$ signal outputs, are simultaneously feed back to influence the state of the latch. Such a differential, dual, feedback normally establishes a latch which is optimally fast to assume either the set or the cleared state.

Continuing with the explanation of the prior art differential feedback latch shown to the left of the dashed line in FIG. 6e, suppose it is wished to store that data, nominally a binary one (1), represented by the High (H)

level of signal (H) SYS DATA into the latch. New system data can be entered into the latch when both the system clock represented by signal (L) SYS CLOCK and the system enable represented by signal (L) SYS ENABLE are active, or true, meaning a Low signal level. For this condition, the base of T10 is lower than the base of T9, and T9 turns on. This steers the current $I_1$ to the path $I_2$. At this time, $I_3$ is nearly zero, and the latch feedback is inactive. Therefore, the state of Q and $\overline{Q}$ can easily be changed by the new system data. For system data such that signals (H) SYS DATA is High, Net Q shows set, or High, and Net $\overline{Q}$ also shows set, or Low. Transistors T5 thru T8 are inactive and add only collector capacitance to the Nets Q and $\overline{Q}$ which allows for the high speeds of a conventional ECL latch.

Continuing in FIG. 6e, data is stored in the latch when either the system clock (signal (L) SYS CLOCK) or system enable (signal (L) SYS ENABLE) goes inactive, false, or High. In this case, $I_1$ is steered in the direction of $I_3$. The differential feedback latch network is then active. If Net Q is higher than Net $\overline{Q}$, the base of transistor T6 will be higher than the base of transistor T7, and transistor T6 will be turned on which will maintain Net $\overline{Q}$ low and Net Q high. The resistors $R_4$ thru $R_7$ are part of the differential feedback latch. For the functionality of this latch, $R_4$ and $R_6$ are not needed and could be set equal to zero. However, the resistor divider $R_4$ and $R_5$, and $R_6$ and $R_7$, are part of the cellular structure and are used to create other latch macros with a set or reset function as part of the differential feedback network. One example is the Rank B scan/set testable latch shown in FIG. 3. Transistors T5, T8, T12, T13, T14, T15, T20, and T21 have grounded collectors and function as emitter followers. Resistor $R_1$ is used to reduce the voltage swings for improved performance within the internal cells of the gate array. Resistor $R_8$ is used to keep the collectors of T9 and T10 from floating to a high potential and produce a glitch during the switching time. Resistor $R_8$ is not needed with a semiconductor process that can consistently yield transistors with low leakage.

Continuing in FIG. 6e, next is described the appended circuitry to the right of the dashed line. this appended circuitry is designed to have a negligible effect on the performance of the ECL latch when the latch is in the system mode while enabling operation in the scan/set test mode (i.e., adding scan/set testability). The appended pended circuitry is connected (collector dotted) to both the set, net Q, and the clear, net $\overline{Q}$, signal outputs of the prior art feedback latch. The term "collector dotted" means wired positive logic AND which is formed by connecting two or more collectors together in some combination of upper and lower switches (such as is the case shown in FIG. 6e and 6f).

In the system mode, either or both the scan/set clock (signal (L) S/S CLOCK) or the scan/set enable (signal (L) S/S ENABLE) applied to such appended circuit are inactive, or false (High). Transistor $T_{22}$ is turned on and the current Source $I_4$ is steered in the direction of $I_5$ and, therefore, bypasses the transistors T18 and T19 which are turned off. In this mode, only the small collector capacitance and the foil capacitance is added to the Net Q and Net $\overline{Q}$. The resulting delay is considerably less than the delay that would be encountered if a multiplex circuit or logic gates were placed in front of the scan/set latch. In the scan/set test mode, the scan/set clock (signal (L) S/S CLOCK) and the scan/set enable(s) signal(s) (signal (L) S/S ENABLE) are both true or active (Low). The current source $I_4$ is steered in the direction of $I_6$, making $I_5$ essentially zero.

Continuing with the explanation of the circuit of the present invention shown in FIG. 6e in the scan/set test mode, it should be pointed out that current source $I_1$ is steered in the direction of $I_3$ and, therefore, the differential feedback portion of the standard latch is still active. Therefore, the state of the differential feedback latch is difficult to change in this active state. Hence, the latch is slow in this mode. The appended portion of the circuitry forceably changes the state of the differential latch even while the feedback is active. For example, assume output Q is Low and output $\overline{Q}$ is High (meaning the latch is cleared) and we wish to change the state of the latch with the appended circuitry. For this case, the scan/set test data signal (H) S/S DATA) is true (high) and Net $\overline{Q}$ must be pulled by transistor T19 to nearly the Low state before the differential latch feedback circuit takes over and changes the state of the latch. The latch feedback takes over when the base voltages of T6 and T7 are equal. At this time, net Q and net $\overline{Q}$ are both near the Low level. The fall delay for output $\overline{Q}$ is reasonably fast, but the rise delay for output Q is quite slow. The output Q does not start to rise until the output $\overline{Q}$ nearly reaches the Low level. The high performance is not needed in the test or maintenance mode.

Continuing in FIG. 6e, optimal transistors $T_3$ and $\underline{T_4}$ are used as diodes to clamp the low levels of Q and $\overline{Q}$. These clamp diodes are used only in the scan/set test mode to clamp the voltage across the swing resistors $R_2$ or $R_3$ when both current sources $I_1$ and $I_4$ are directed or steered through the same swing resistor $R_2$ or $R_3$. The anode of the clamp diodes are referred to the TEE resistors $R_1$ and $R_{13}$ which gives better noise margins at higher temperatures.

Continuing in FIG. 6e, the set, or the reset, function of the latch is incorporated as part of the appended scan/set circuitry. The method used gives good noise margins. The set or reset function is typically used to initialize a chain of scan/set latches with an alternate pattern of "1"s and "0"s. In this way, a break in the scan/set chain can be detected. To set or reset the latch, the scan/set clock (signal (L) S/S CLOCK) or scan/set enable (signal (L) S/S ENABLE) must be false, or High, and the system clock (signal (L) SYS CLOCK) or system enable (signal (L) SYS ENABLE) must also be false, or High. In this mode, the latch functions in a similar fashion as during scan/set test. One only of the set, or the reset, function as are respectively enabled through transistor T25 connecting to net $\overline{Q}$, or through transistor T16 connected to Net Q, is realizable when the total circuit of FIG. 6e is implemented from two (only) of the particular quarter cells of the gate array technology previously described. Normally only the set, or the reset, capability is desired (dependent upon latch position in the logic design) and the preferred embodiment of the present invention thusly exists in two minor variants, one with set (transistor T25 but not transistor T16) and one with reset (transistor T16 but not transistor T25) capability. It is, of course, possible to implement the circuit of the present invention with both set and reset capability (both transistors T25 and T16).

Figure 6F:
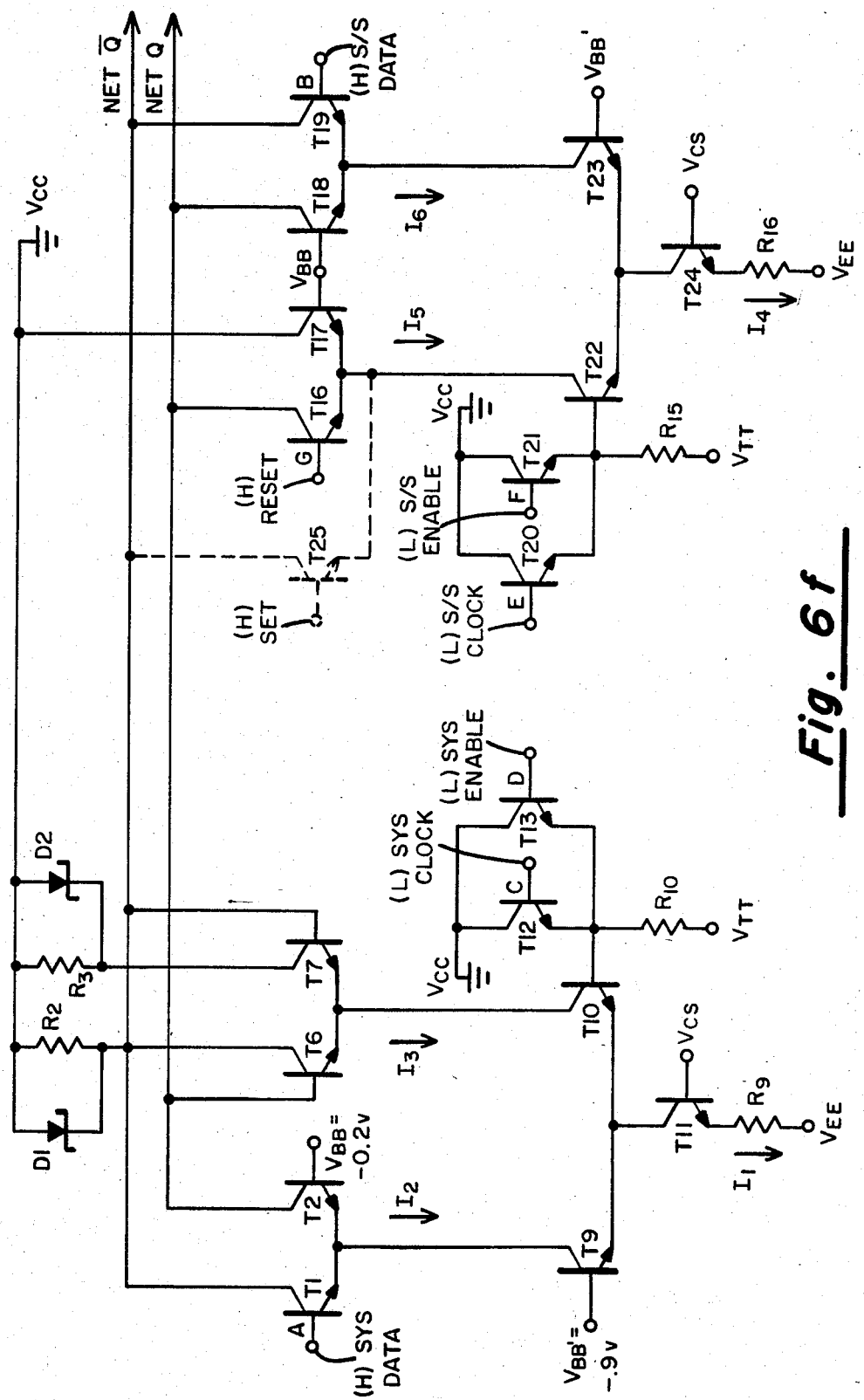
FIG. 6f shows a schematic diagram of a second preferred embodiment implementation of the present invention of a scan/set testable latch when implemented in Current Mode Logic (CML).

The present invention when implemented in Current Mode Logic (CML) is shown in FIG. 6f. The correspondence of structures with the Emitter Coupled Logic (ECL) representation of the present invention shown in FIG. 6e may readily be observed. The CML circuit shown in FIG. 6f is the same as the ECL circuit shown in FIG. 6e except that emitter followers T5, T8, T14, and T15 are removed. Thus resistors $R_4$, $R_5$, $R_6$, $R_7$, $R_{11}$, and $R_{12}$ are also not needed. Resistors $R_8$ and $R_{14}$ are not necessary in CML. Finally the TEE resistors $R_1$ and $R_{13}$ are not needed since CML intended swings are 400 millivolts instead of 600 millivolts for ECL. Schottky diodes D1 and D2 are used as diode clamps, instead of utilizing T3 and T4 as wree shown in the ECL circuit of FIG. 6e, to better keep the upper current switches out of saturation.

Describing both the ECL and the CML preferred embodiimplementations of the present invention of a scan/set testable latch employing two levels of series gating, it may be noted that the present invention is essentially an apparatus appended to, and method applied to, the set Q and clear $\overline{Q}$ signal outputs of a prior art feedback latch (not in of itself scan/set testable) which apparatus and which method thusly renders, in aggregate, such latch to be scan/set testable, ergo a scan/set testable latch. The appended circuit apparatus serves, through such connections to the set Q and clear $\overline{Q}$ signal outputs of the prior art feedback latch, to set and clear the latch—also commonly called backset and backclear being that such is accomplished through the normal output signal lines of the latch—responsively to enabled and clocked scan/set test data, and regardless of such feedback currents within the feedback latch as are continuously and simultaneously operative. The preferred feedback latch is a differential feedback latch. The basic appended circuit apparatus of the present invention which accomplishes this backsetting or backclearing of the differential feedback latch in accordance with the scan/set test data does itself employ two levels of series gating, and utilizes the same two current sources as does the differential feedback latch. The basic appended circuit of the present invention firstly consists of a current source (preferably a constant current source) which may be observed as transistor T24 and resistor $R_{16}$ in each of FIGS. 6e and 6f, and which may be identified as a current source by comparison to that internal current source shown in FIG. 2b. The basic appended circuit of the present invention secondly consists of a first current switch (preferably a differential current switch) collector dotted connected with each one of the set Q and clear $\overline{Q}$ signal outputs of the differential feedback latch circuit which, when supplied with a current, switches the current in accordance with the binary state of the scan/set data input signal either to backset or to backclear the latch or which, when not supplied with a current, does naught but present a small (foil) capacitance to the signal outputs of such differential feedback latch circuit (thusly but minutely affecting the normal mode operational speed of such latch). Such a first current switch may be observed as transistors T18 and T19 in each of FIGS. 6e and 6f, and may be identified to be a current switch by comparison to those upper internal switches shown in FIG. 2b. The basic appended circuit of the present invention next, thirdly, consists of a second current switch (preferably a differential current switch) for directing the current from the current source to either the first current switch, in the case of both enabled and clocked scan/set test, or to ground (thus disabling that any scan/set data should be used by the first current switch to backset or to backclear the latch) when scan/set test is either not enable, not clocked, or both. Such a second current switch may be observed as transistors T22 and T23 in each of FIG. 6e and 6f (plus resistor $R_{14}$ shown in FIG. 6e which is optional for the ECL or CML implementation of such second current switch), and may be identified to be a current switch by comparison to that lower internal switch shown in FIG. 2b. The basic appended Circuit of the present invention finally, fourthly, consists of circuit which does supply a control signal to the second current switch, which control signal is binary stated to indicate that either scan/set test is both enabled and clocked, or, alternatively, the scan/set test is either not enabled, not clocked, or both not enabled and not clocked. In particular such circuit supplying the control signal (which is received into the base of T22 of the second current switch) is actually a lower internal level shifter which may be observed as transistors T20 and T21 plus resistor $R_{15}$ in each of FIGS. 6e and 6f, which observed circuit may be identified to be a level shifter by comparison to FIG. 2b. In operation, transistors T20 and T21 which are respectively responsive to the scan/set clock (signal (L) S/S CLOCK) and the scan/set enablement (signal (L) S/S ENABLE) sinnals in cooperation with resistor $R_{15}$ do serve to logically AND such signals in order to produce that signal (fed into the base of T22) which does control the second current switch. This is because transistors T20 and T21 are emitter followers; therefore, when the base of both T20 and T21 are Low (the ANDed true condition of both the scan/set clock and scan/set enablement), then these Low signal conditions are fed one diode drop down to the base of T22, pulling such base of T22 low relative to the base of T23 (to which $V_{BB}'$ is supplied), therefore turning off T22 and switching $I_4$ in the direction of $I_6$ (toward the first current switch and away from the $I_5$ path to ground).

In order to understand that only these four circuit elements are necessary to the basic function of the basic appended circuit apparatus to enable scan/set testability, it should be known that transistor T17 (shown in FIGS. 6e and 6f) could be replaced with a straight conductor (wire, or lead) from the collector of T22 equivalently either to 1) $R_{13}$ to $V_{cc}$ which is ground in the ECL implementation of the present invention shown in FIG. 6e, or to 2) $V_{cc}$ which is ground in the CML implementation of the invention shown in FIG. 6f. Additionally, with the replacement of transistor T17 by a straight conductor it should be known that transistors T25 and T16 could be eliminated, if neither the set nor the reset capability were implemented (which does not abrogate scan/set testability, but merely makes such but poorly initializable). Furthermore, resistor $R_{14}$ shown (only) in FIG. 6e is but a glitch resistor and should not be considered necessary in the implementation of a lower current switch in either CML or ECL.

Therefore, a first enhancement of the basic appended circuit of the invention is a third current switch (preferably a differential current switch) inserted in series within that path between the second current switch and ground, which current switch is responsive to either a true set signal, or to a true reset signal, for switching such current as the second current switch, when so enabled, does direct toward ground instead to either the clear Q, or to the set $\overline{Q}$, signal outputs of the differential feedback latch in order to thereby such switching, and respectively responsively to the true set or to the true reset signal, either to set or to clear such differential feedback latch, as the case may be, elsewise if neither such set nor such reset signal be true switching such current as is directed toward ground by such second current switch actually to ground (ergo, such third current switch becomes, in the eventuality of neither such set nor such reset signal, a nullify). Such a third current switch may be observed as transistors T16 and T17 (Reset) or T25 and T17 (Set) (either or both as is optional with the respective enablement of set or reset or both set and reset) in each of FIGS. 6e and 6f, and may be identified to be a current switch by comparison to those upper internal switches shown in FIG. 2b. Such transistors T25 and T17, or transistors T16 and T17, (all shown in each of FIG. 6e and 6f) actually form a differential current switch wherein either the reset signal (signal (H) RESET) the set signal (signal (H) SET) or the logic AND of both the set and the reset signal (in the case that both T25 and T16 are implemented) will be compared with a reference voltage ($V_{BB}$) to control the current switching either to (one or both of) the clear Q and set Q signal outputs, or to ground.

A second enhancement of the basic appended circuit are transistors, serving as clamp diodes, connected to either or both of the set Q or clear $\overline{Q}$ signal outputs of the differential feedback latch, which transistors serve to clamp the voltage appearing on such set Q or clear $\overline{Q}$ signal outputs. Such transistors serving as clamp diodes may be observed as T3 and T4 in FIG. 6e, while Schottky diodes D1 and D2 are used for clamps for the CML configuration 6f.

There are additional, subsidiary, features and embellishments, which features are normal of inclusion in prior art scan/set testable latches, incorporated within the latch of the present invention. As already described for the particular embodiment, provision is made in the scan/set testable latch of the present invention to provide a logical "AND" between the system clock and the system enable, such condition as is preferred by systems designers. Furthermore, the scan/set testable latch of the present invention supports multiphase clock systems wherein four or more phases are used in the system data path while only two phases are used in the scan/set path.

In summary of the preferred embodiments of the present invention, although the particular scan/set testable latch of the invention is slow in the scan/set test mode, this approach allows the scan/set testable macro circuit of the present invention to be efficiently laid out using only two current and minimum of silicon area while employing common, building block, gate array cellular structures. The preferred embodiments scan/set testable latch of the present invention requires 24 transistors (when either set or reset is implemented, elsewise 25 transistors if both set and reset are implemented) and 16 resistors to implement.

While the present invention has been described with reference to two particular ECL and CML preferred embodiments, and with reference to settable and resettable variants of such preferred embodiments, it is to be recognized that the method of the present invention wherein an appended circuit is used to backset or backclear a latch in accordance with scan/set test data, thereby rendering the entire latch plus appended circuitry a scan/set testable latch, could be adapted by those skilled in the art to other configurations. For example, the relative usage of scan/set test enablement, clock, and data signals as between the first and the second current switches could be altered without substantially altering the nature or operation of the present invention. For example, three current switches in series, each respectively controlled by the scan/set test enablement, clock, and data signals could have been used as an appended circuit in control of a latch of three series gated levels, although such is a more significant departure from the present invention which teaches, and claims, the advantages of two (only) levels of series gating. Therefore, the invention should not be construed narrowly but rather within the spirit and scope of the following claims:

What is claimed is:

1. An addition improvement to the apparatus of feedback latch circuit employing two levels of series gating and one current source to the end that such latch circuit should be made scan/set testable responsively to received scan/set data, scan/set clock, and scan/set enablement signals, said improvement comprising:

current source means for supplying a current;

first current switch means collector dotted connected with each one of the set Q and clear $\overline{Q}$ signal outputs of said feedback latch circuit for, IF supplied with a current, THEN, responsively to the binary state of a received said scan/set data signal, switching said current either to said set Q or to said clear $\overline{Q}$ signal outputs as said binary state of said scan/set data signal dictates, in order by said current switching to said set Q or to said clear $\overline{Q}$ signal outputs respectively either to clear or to set said feedback latch circuit, despite such feedback currents as therein exist, ELSE IF not supplied with a current, THEN conducting no current to either said set Q or said clear $\overline{Q}$ signal outputs and presenting but a small capacitance to each said set Q and said clear $\overline{Q}$ signal outputs:

second current switch means connected intermediary said current source means and said first current switch means for, responsively to the binary state of a control signal, IF said control signal is true THEN switching said current supplied be said current source means to said first current switch means ELSE IF said control signal is false, THEN switching said current supplied by said current source means toward ground; and scan/set test control means for, IF both a received said scan/set clock signal and said scan/set enablement signal exist in the true condition, THEN providing the true state of said control signal to said second current switch means, ELSE IF either said scan/set clock signal or said scan/set enablement signal or both exist in the false condition, THEN providing the false state of said control signal to said second current source means.

2. The addition improvement to a latch circuit apparatus making such latch circuit apparatus scan/set testable of claim 1 wherein said current source means further comprises:

constant current source means for supplying a constant current.

3. The addition improvement to a latch circuit apparatus making such latch circuit apparatus scan/set testable of claim 1 wherein said first current switch means further comprises:

first differential current switch means collector dotted connected with each one of the set Q and clear $\overline{Q}$ signal outputs of said feedback latch circuit for IF supplied with a current, THEN responsively to the condition that IF the binary level of the received scan/set data signal is greater than a first reference voltage THEN conducting current to said clear Q signal output, while not conducting current to said set $\overline{Q}$ signal output, sufficient to cause said feedback latch circuit, despite such feedback currents as therein exist, to set, ELSE IF said binary level of said scan/set data signal is less than said first reference voltage THEN conducting current to said set Q signal output, while not conducting current to said clear $\overline{Q}$ signal output, sufficient to cause said feedback latch circuit, despite such feedback currents as therein exist, to clear, ELSE IF not supplied with a current, THEN conducting no current to either said set Q or said clear $\overline{Q}$ signal outputs and presenting but a small capacitance to each of said set Q and said clear $\overline{Q}$ signal outputs.

4. The addition improvement to a latch circuit apparatus making such latch circuit apparatus scan/set testable of claim 3 wherein said second current switch means further comprises:

second differential current switch means connected intermediary said current source means and said first current switch means for, responsively to the binary level of a control signal, IF said binary control signal is true meaning less than a second reference voltage WHEREIN said second reference voltage is of greater magnitude than said first reference voltage, THEN switching said current supplied by said current source means to said first current switch means, ELSE IF said binary control signal is false meaning greater than said second reference voltage, THEN switching said current supplied by said current source means toward ground.

5. The addition improvement to a latch circuit apparatus making such latch circuit apparatus scan/set testable of claim 1 wherein said scan/set test control means further comprises:

scan/set test control logic means for, IF both a received said scan/set clock signal and said scan/set enablement signal exist in the true condition, meaning at a Low signal level, THEN passing the Low signal level of both said scan/set clock signal and said scan/set enablement signal, level-shifted one diode drop down, to said second current switch means as the true, Low, state of said control signal ELSE IF either said scan/set clock signal or said scan/set enablement signal or of both exist in the false condition, meaning at a High signal level, THEN providing a voltage source through a resistor to said second current source means as the false, High, state of said control signal.

6. The addition improvement to a latch circuit apparatus making such latch circuit apparatus scan/set testable of claim 1, said circuit apparatus also receiving a set signal, which further comprises:

set switch means intermediary said second current switch means and said ground for IF said second current switch means does switch said current supplied by said current source means toward ground, THEN, responsively to the binary state of a received said set signal, IF said set signal is true, THEN switching said current toward ground received of said second current switch means to said clear $\overline{Q}$ signal output of said feedback latch circuit sufficient to set said feedback latch circuit, said current continuing to ground, ELSE IF said set signal is false, THEN switching said current toward ground received of said second current switch means again toward ground and without effect upon said clear $\overline{Q}$ signal output, ELSE IF said second current switch means does not switch said current supplied by said current source means toward ground, THEN conducting no current to either said clear $\overline{Q}$ signal output of said feedback latch circuit or to ground, and presenting but a small capacitance to both said clear $\overline{Q}$ signal output and said ground.

7. The addition improvement to a latch circuit apparatus making such latch circuit apparatus scan/set testable of claim 6 wherein said set switch means further comprises:

set differential current switch means intermediary said second current switch means and said ground for IF said second current switch means does switch said current supplied by said current switch means toward ground, THEN, responsively to the binary level of a received said set signal, IF said set signal is true meaning greater than a reference voltage, THEN switching said current toward ground received of said second current source means to said clear $\overline{Q}$ signal output of said feedback latch circuit sufficient to set said feedback latch circuit said current continuing to ground, ELSE IF said set signal is false meaning less than said reference voltage, THEN switching said current toward ground received of said second current source means again toward ground, and without effect on said clear $\overline{Q}$ signal output, ELSE IF said second current switch means does not switch said current supplied by said current source means toward ground, THEN conducting no current to either said clear $\overline{Q}$ signal output of said feedback latch circuit or to ground, and presenting but a small capacitance to both said clear $\overline{Q}$ signal output and said ground.

8. The addition improvement to a latch circuit apparatus making such latch circuit apparatus scan/set testable of claim 1, said circuit apparatus also receiving a reset signal, which further comprises:

reset switch means intermediary said second current switch means and said ground for IF, said second current switch means does switch said current supplied by said current source means toward ground, THEN, responsively to the binary state of a received said reset signal, IF said reset signal is true, THEN switching said current toward ground received of said second current switch means to said set Q signal output of said feedback latch circuit sufficient to clear said feedback latch circuit, said current continuing to ground, ELSE IF said set signal is false, THEN switching said current toward ground received of said second current switch means again toward ground and without effect upon said set Q signal output, ELSE IF said second current switch means does not switch said current supplied by said current source means toward ground, THEN conducting no current to either said set Q signal output of said feedback latch circuit or to ground, and presenting but a small capacitance to both said set Q signal output and said ground.

9. The addition improvement to a latch circuit apparatus making such latch circuit apparatus scan/set testable of claim 8 wherein said reset switch means further comprises:

reset differential current switch means intermediary said second current switch means and said ground for IF said second current switch means does switch said current supplied by said current switch means toward ground, THEN, responsively to the binary level of a received said reset signal, IF said reset signal is true meaning greater than a reference voltage, THEN switching said current toward ground received of said second current source means to said set Q signal output of said feedback latch circuit sufficient to clear said feedback latch circuit, said current continuing to ground, ELSE IF said set signal is false meaning less than said reference voltage, THEN switching said current toward ground received of said second current source means again toward ground, and without effect on said set Q signal output, ELSE IF said second current switch means does not switch said current supplied by said current source means toward ground, THEN conducting no current to either said set Q signal output of said feedback latch circuit or to ground, and presenting but a small capacitance to both said set Q signal output and said ground.

10. The addition improvement to a latch circuit apparatus making such latch circuit apparatus scan/set testable of claim 1 which further comprises:
   first clamp diode means connected intermediary said set Q signal output of said feedback latch and ground for clamping the voltage appearing in said set Q signal output; and
   second clamp diode means connected intermediary said clear $\overline{Q}$ signal output of said feedback latch and ground for clamping the voltage appearing on said clear Q signal output.

11. The addition improvement to a latch circuit apparatus making such latch circuit apparatus scan/set testable of claim 1 implemented in Emitter Coupled Logic (ECL) in gate array technology with two levels of series gating and two current sources.

12. The addition improvement to a latch circuit apparatus making such latch circuit apparatus scan/set testable of claim 1 implemented in Current Mode Logic (CML) in gate array technology with two levels of series gating and two current sources.

* * * * *